United States Patent [19]

Beeman

[11] Patent Number: 4,718,862

[45] Date of Patent: Jan. 12, 1988

[54] TWO-WAY ELECTRICAL APPARATUS HANDLE

[75] Inventor: Dean A. Beeman, Fair Haven Township, Monmouth County, N.J.

[73] Assignee: AT&T, New York, N.Y.

[21] Appl. No.: 853,497

[22] Filed: Apr. 18, 1986

[51] Int. Cl.[4] ............................................. H01R 11/09
[52] U.S. Cl. .................................... 439/482; 439/169;
439/680; 439/481
[58] Field of Search ............... 339/58, 108 TP, 108 R, 339/184 R, 149 R, 149 P, 110 P, 31 T, 31 M, 32 R, 97 T, 186 R, 186 M; 439/482, 169, 680, 481

[56] References Cited

U.S. PATENT DOCUMENTS 2,535,002 10/1947 Weber .
2,785,258 12/1953 Haigh .
2,857,572 10/1958 Belart .
3,535,638 10/1970 Michelin ............................. 339/28
4,101,756 7/1978 Yamano ............................. 339/58
4,105,968 8/1978 Mobley et al. ............... 339/108 TP
4,288,684 9/1981 Katou et al. ......................... 339/58
4,420,209 12/1983 Reis et al. ....................... 339/184 M Primary Examiner—Gil Weidenfeld
Assistant Examiner—Thomas M. Kline
Attorney, Agent, or Firm—J. F. Spivak

[57] ABSTRACT

The present invention is a "two-way" handle that accepts an electrical cord in one end and an interchangeable electrical apparatus, e.g., test probe cartridges for nondestructive resistivity measurements in the other end, and wherein the handle can accept said electrical cord or electrical apparatus in either end interchangebly, or when desired, two electrical cords, one at each end of the handle.

5 Claims, 5 Drawing Figures

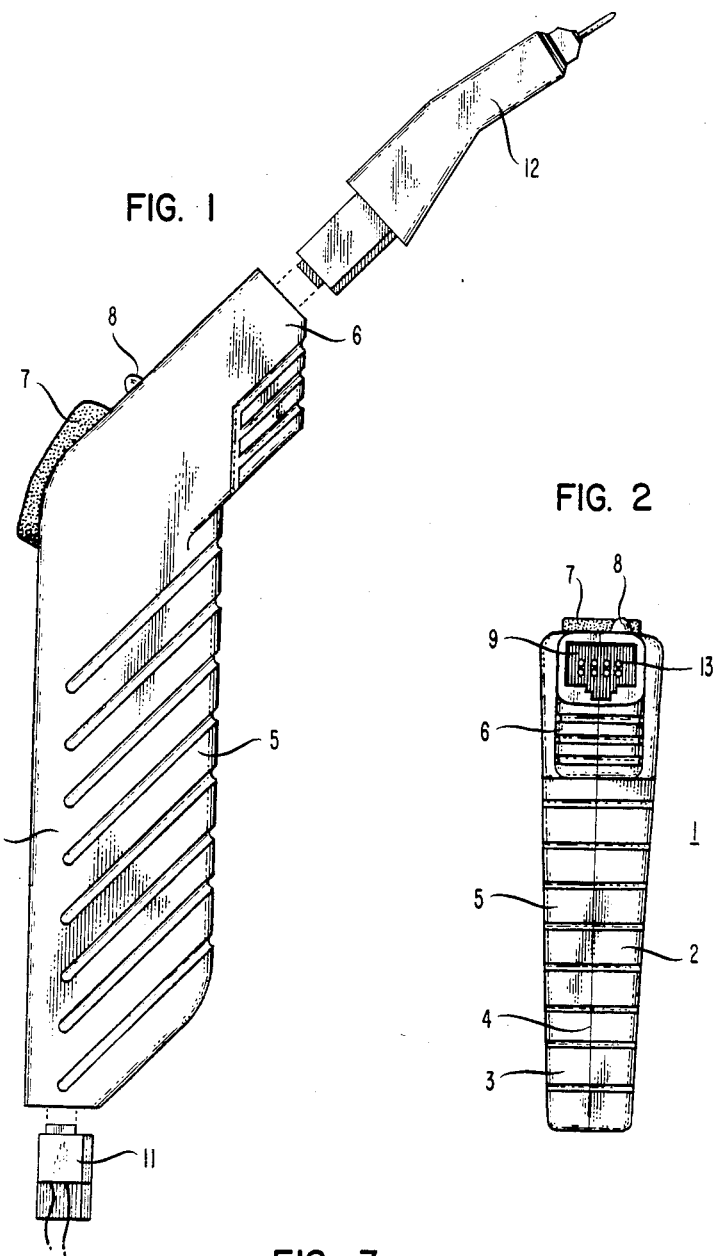
FIG. 1
FIG. 2
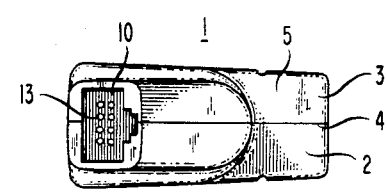
FIG. 3

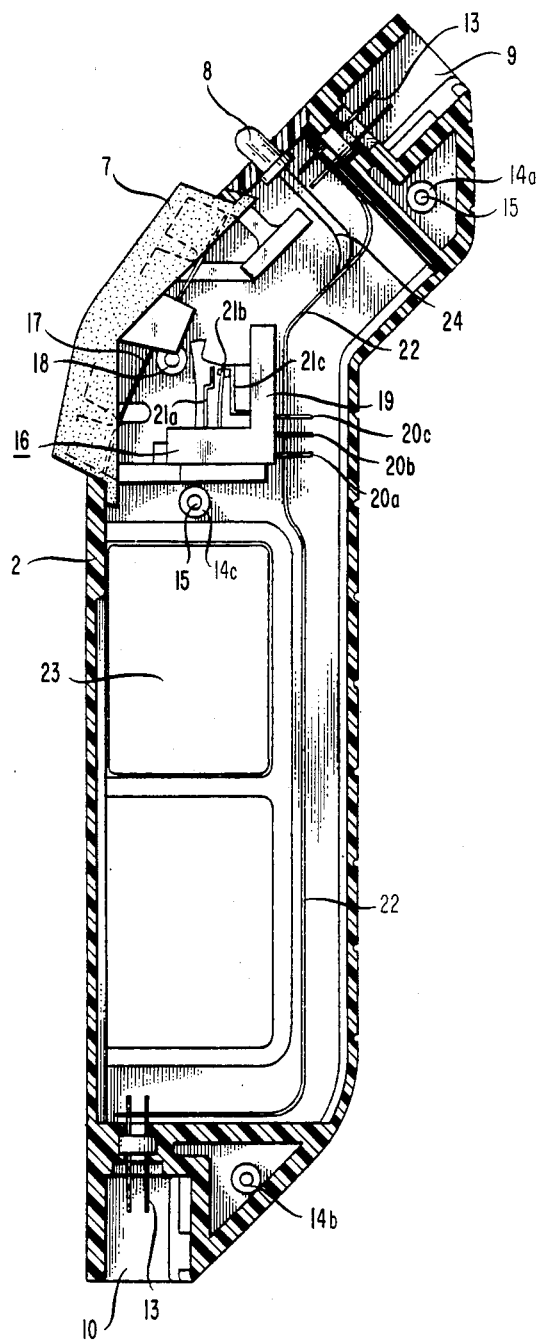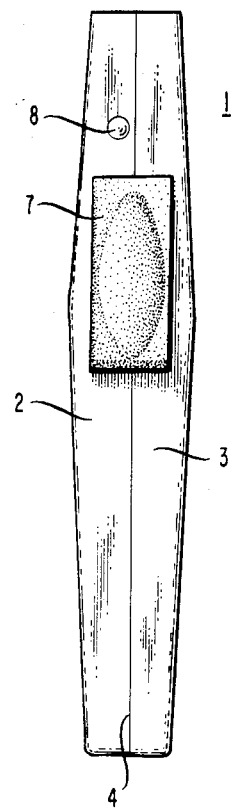

TWO-WAY ELECTRICAL APPARATUS HANDLE

TECHNICAL FIELD

The present invention relates to a handle for an electrical apparatus.

BACKGROUND OF THE INVENTION

Hand held electrical apparatuses are generally provided with a handle which is fixed with respect to the apparatus, that is, nonremovable with respect to the rest of the apparatus. Further, such handles generally contain either a permanently mounted electrical cord therein or means for plugging an electrical cord into one side of the handle while the other side of the handle is separately adapted to and fixed to the remainder of the electrical apparatuses.

In certain electrical apparatus, such as in an apparatus known as the AT&T Microhmeter used for the precision nondestructive testing of metals, it is desirable to use a handle which is adapted to accept a variety of test probes at one end of the handle and an electrial cord at the other end of the handle. Through working with such testing apparatus it has also been discovered that it is desirable to employ a handle such that the test probe and/or the electrical cord may be inserted in either end of the handle, interchangeably, or whereby the handle may accept two electrical cords, one at each end of the handle, one cord being coupled to a test probe at the end opposite that attached to the handle, thus allowing infinite combinations of operator positions.

SUMMARY OF THE INVENTION

The present invention is a "two-way" handle that accepts an electrical cord in one end and an interchangeable electrical apparatus, e.g., test probe cartridges for nondestructive resistivity measurements in the other end, and wherein the handle can accept said electrical cord or electrical apparatus in either end interchangeably, or when desired, two electrical cords, one at each end of the handle.

BRIEF DESCRIPTION OF THE DRAWINGS

FIG. 1 is a side elevational view of an embodiment of the novel handle;

FIG. 2 is a bottom elevational view of the handle shown in FIG. 1;

FIG. 3 is a front elevational view of the handle shown in FIG. 1;

FIG. 4 shows a top elevational view of the handle shown in FIG. 1; and

FIG. 5 is a side elevational view of the left side of the handle shown in FIG. 4.

DETAILED DESCRIPTION OF THE INVENTION

The following detailed description relates to a specific embodiment of the invention which is particularly suitable for use as a handle for an AT&T Michrometer nondestructive resistance testing apparatus. This handle is adapted to accept interchangeable resistance testing probes of variable probe tip spacings and geometry, and an electrical cord at either end of the handle. The handle is designed so as to provide the probe with either a short extension when plugged in one side of the handle, or a long extension when plugged into the other side of the handle with respect to where the handle is held. This feature will become more apparent hereinafter. It should be understood, while the novel concept is particularly described with reference to the aforementioned nondestructive testing apparatus, the concept of a handle having the ability to accept interchangeable electrical devices at either end thereof, as well as an electrical cord at either end thereof in the same receptacle in which said device is accepted, is adaptable to many other electrical apparatuses as well.

Referring to the specific embodiment described herein, FIGS. 1–4 show various elevational views of the novel handle. FIG. 5 shows an elevational view of one half of the handle split along its axis.

Refering the FIGS. 1–5 there is shown a handle 1 in accordance with an embodiment of the invention. The handle 1 which may be made of a molded plastic, comprises two halves, a left half 2 and a right half 3 which are joined together after insertion of any internal members forming seam 4. The handle is preferably formed so as to have an elongated portion 5 and a shorter portion 6 which extends at an angle from the elongated portion 5. Typically, the angle between the axis of the elongated portion 5 and the shorter portion 6 is about 45°. Mounted along the top aspect of the handle bridging the portions between where the elongated portion 5 of the handle 1 meets the shorter portion 6 of the handle 1 is a switch actuator 7. Ajacent to and spaced from the switch actuator 7 is an optional on/off indicator lamp 8. As can be seen from the front and bottom views of the handle, FIGS. 2 and 3, respectively; the handle is provided with keyed channels 9 and 10 for insertion of an electrical device, e.g., test probe 12, and an electrical cord 11 interchangeably in either end of the handle 1. The power cord 11 and resistance measuring probe 12 are shown ajacent the bottom channel 10 and top channel 9, respectively, ready for insertion therein. At the base of each of said channels 9 and 10 are connector means for making electrical connection between the electrical cord 11 and probe 12 through the handle 1. In the embodiment shown, such interconnection means are male pin connectors 13 which communicate with and extend into mating female receptacles of the electical cord 11 and resistance probe 12 when such cord 11 and probe 12 are inserted into the channels 9 or 10. These connectors fit snugly into a slot molded into the handle 1. Details of a typical resistance probe and the operation of a typical nondestructive testing apparatus of the type described herein are set forth in U.S. patent application Ser. No. 499,554, filed May 31, 1983, by R. L. Cohen and K. W. West, now U.S. Pat. No. 4,667,149, which application is assigned to the same assignee as this application and which application is incorporated herein by reference.

Referring to FIG. 5, there is shown an elevational view of the left hand member 2 of the handle 1. In addition to the features which can be seen from FIGS. 1–4, the left hand member 2 of handle 1 is shown to have three buttons 14a–14c, one, 14a, in the vicinity of the top portion of the handle 1; one, 14b, in the vicinity of the bottom portion of the handle 1; and one, 14c, in the vicinity of the central portion of the handle 1. Each button is provided with a teet 15 which extends therefrom. During assembly, when the left hand member 2 of the handle 1 is coupled to the right hand member 3 of the handle 1, the teets of each button align with and fit into corresponding receptacles therefor in the right hand member 3 of the handle 1. The left and right hand members 2 and 3 can easily be secured together by making these members snap fit together or an adhesive may be placed on each of the teets before assembly and the left and right hand members may be glued together thereby. Further, if desired, the left and right hand members may be heat sealed together along the seam 4 as well.

The handle 1 is shown to have mounted therein a single pole double throw switch assembly 16. The position of the switch contacts of switch assembly 16 are altered by means of depressing the switch actuator 7 which then urges and depresses a member of the switch assembly 16 so as to change the electrical path. The switch actuator 7 incorporates a return spring mechanism, such as a leaf spring 17, which rests on a raised member 18 of the handle 1. When depressed, the spring 17 is urged against the raised member 18 and automatically returns the switch actuator 7 back to its initial position when pressure is released therefrom. The switch assembly 16 includes a switch body 19 having extending therethrough a set of switch connection pins 20 20a-20c which are coupled to or extensions of respective switch contacts 21a-21c. Circuit means 22, for operating and/or innterconnecting the particular electrical apparatus extends within a channel in the handle 1 and is soldered to the contact pins 13 so as to interconnect the various contact pins 13 on either end of the handle with each other and with the switch activator pins 20a-20c. These circuit means 22 may be a set of interconnecting wires, but is preferably a flexible printed circuit board which can include not only conductive leads but other circuit elements as well. This electrically couples the electrical cord input with appropriate portions of the probe. In order to add stability and increase balance of the handle so as to facilitate its use and handling, the handle may also optionally incorporate a weight 23, such as a lead weight, in the central region thereof. The optional indicator light 8, incorporated in the device as shown, has wire leads 24 which connect the light to the circuit on the circuit board 22 and indicates the position of the switch, i.e., on or off. With this unique switch geometry, the switch can be activated by the thumb, palm, or finger.

In operation, the handle may accept any one of many interchangeable probes in either the top channel or bottom channel of the handle. Similarly, an electrical cord is then accepted and attached to the handle in either the top or bottom channel thereof. The design of the handle is such that if one grasps the handle along the elongated portion thereof, placing the probe 12 in channel 9 and the electrical cord into channel 10, the apparatus is easily activated by depressing the actuator switch 7 with one's thumb. If, however, one desires or requires a probe having an extended arm, one may then attach the probe 12 to the handle through channel 10, and the electrical cord to the handle through channel 9, and then grip the handle at the shorter end thereof. This gives rise to a probe having an effective extended length. When gripping the handle in this position, the switch actuator is easily depressed by means of pressure applied by the palm of the hand just below the base of the thumb.

What is claimed is:

1. A handle for an electrically operated apparatus comprising a body portion for gripping said handle, said body having an elongated portion and a shorter portion extending at an angle from said elongated portion, connector means at each end of said body for connecting an electrical cord and an electrical device through said handle, said connector means allowing said cord and device to be insertable in either end of said handle interchangeably, means within said handle for electrically coupling said connector means at each end of said handle, a switch actuator extending from said body and a switch mounted within said body in a manner so as to be activated by said switch actuator, said switch being electrically coupled to said connector means so as to make and break the circuit between said connector means, and wherein said switch actuator extends along the top of said body in the region bridging where said elongated portion meets said shorter portion.

2. The handle recited in claim 1 including a weight therein in a position to add balance and stability to the handle.

3. The handle recited in claim 1 wherein the connector means resides in keyed channels at each end of said handle.

4. The handle recited in claim 3 wherein said connector means comprises a plurality of spaced male connector pins.

5. The handle recited in claim 4 wherein said keyed channels and connector means are adapted to accept a multiple prong resistance probe.

* * * * *